(12) United States Patent
Gurov

(10) Patent No.: US 8,093,884 B2
(45) Date of Patent: Jan. 10, 2012

(54) DIRECTIONAL COUPLER

(75) Inventor: Gennady G. Gurov, Loveland, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 460 days.

(21) Appl. No.: 12/426,720

(22) Filed: Apr. 20, 2009

(65) Prior Publication Data

US 2010/0264901 A1 Oct. 21, 2010

(51) Int. Cl.
*H01P 5/12* (2006.01)
*H01P 5/18* (2006.01)

(52) U.S. Cl. ......... 324/76.11; 333/109; 333/116

(58) Field of Classification Search .......... 324/76.11; 333/109–116
See application file for complete search history.

(56) References Cited

U.S. PATENT DOCUMENTS 5,629,653 A 5/1997 Stimson
2008/0197938 A1* 8/2008 Hussain et al. ........... 333/116

FOREIGN PATENT DOCUMENTS

DE 3228993 A1 2/1984
DE 19837025 A1 2/2000
EP 0752757 A1 8/1997

OTHER PUBLICATIONS

Mitrovic, Bayer, "PCT International Search Report and Written Opinion re PCT/US2010/031465", Jun. 2, 2010, Published in: PCT.

* cited by examiner

*Primary Examiner* — Melissa Koval
*Assistant Examiner* — Farhana Hoque
(74) *Attorney, Agent, or Firm* — Neugeboren O'Dowd PC; Sean R. O'Dowd

(57) ABSTRACT

One embodiment comprises a directional coupler system comprising a substrate having a top surface and a backside surface, with the backside surface comprising a metalization ground portion and an unmetalized portion. A power line is coupled to the top surface, with the power line having an input adapted to receive a power signal, a first trace coupled to the input, a second trace in parallel with the first trace and coupled to the input, and an output coupled to the first and second traces and adapted to emit the power signal. A sensor line is coupled to the backside surface unmetalized portion, with the sensor line adapted to emit a sensor line signal having a sensor line signal level generally proportional to the power signal. Finally, a thermo-conductive base platform coupled to the metalized portion of the backside surface.

16 Claims, 8 Drawing Sheets

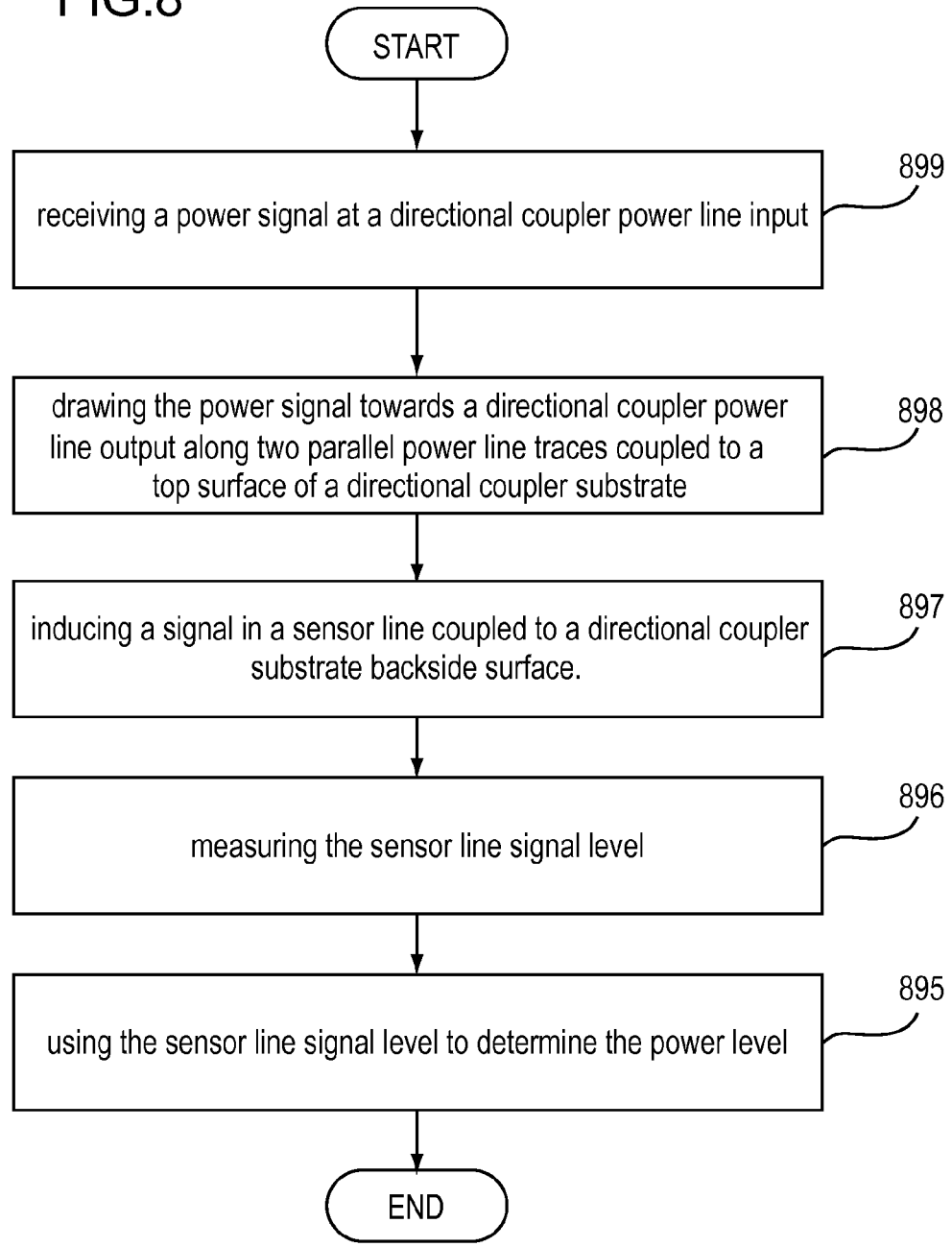

US 8,093,884 B2

DIRECTIONAL COUPLER

FIELD OF THE INVENTION

The present invention generally relates to directional couplers. In particular, but not by way of limitation, embodiments of the present invention relate to a high power directional coupler adapted for use in plasma processing systems.

BACKGROUND OF THE INVENTION

Directional couplers are used to measure RF power transmitted from RF generators to a load. In plasma processing systems, it is important to consistently obtain accurate RF power measurements of the power transmitted to the plasma processing chamber from the generator. In order to receive accurate RF power readings, geometric stability of the directional coupler is typically necessary, as well as a stable surrounding electromagnetic field. Furthermore, due to the high power levels passing through directional couplers used in plasma processing, reliable thermal interfacing with an external heat sink is also desired in order to produce consistently accurate coupler readings.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

One embodiment of the invention comprises a directional coupler system comprising a substrate, a power line, a sensor line, and a thermo-conductive base platform. The substrate comprises a top surface and a backside surface, with the backside surface having a metallization ground portion. Another portion of the backside surface is not metalized. The power line is (i) coupled to the top surface, and (ii) comprised of an input adapted to receive a power signal. The power line further comprises a first trace coupled to the input, a second trace in parallel with the first trace and also coupled to the input, and an output (i) coupled to the first and second traces and (ii) adapted to emit the power line signal. The sensor line is (i) coupled to the non-metalized portion of the backside surface and (ii) adapted to emit a sensor line signal having a level generally proportional to the power signal. The thermo-conductive base platform is coupled to the metalized portion of the backside surface.

Another embodiment of the invention comprises a method of determining a power level supplied to a plasma chamber from an RF generator. One method comprises receiving power at a directional coupler power line input. The power is then drawn towards a directional coupler power line output along two parallel power line traces. The two parallel power line sections are coupled to a top surface of a directional coupler substrate. A signal is then induced in a sensor line coupled to a substrate backside surface. A sensor line signal level is then measured and used to determine the power level being supplied to the plasma chamber.

Yet another embodiment of the invention comprises a directional coupler. One directional coupler comprises a dielectric substrate having a top surface and a backside surface. The top surface comprises a power line input port, a power line output port, a first power line trace extending between the input port and the output port, and a second power line trace in parallel with the first power line trace extending between the input port and the output port. The backside surface comprises a sensor line.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

FIG. 8 is a flow chart comprising a method of determining a power level supplied to a plasma chamber from an RF generator in accordance with an illustrative embodiment of the invention.

DETAILED DESCRIPTION

Figure 1:
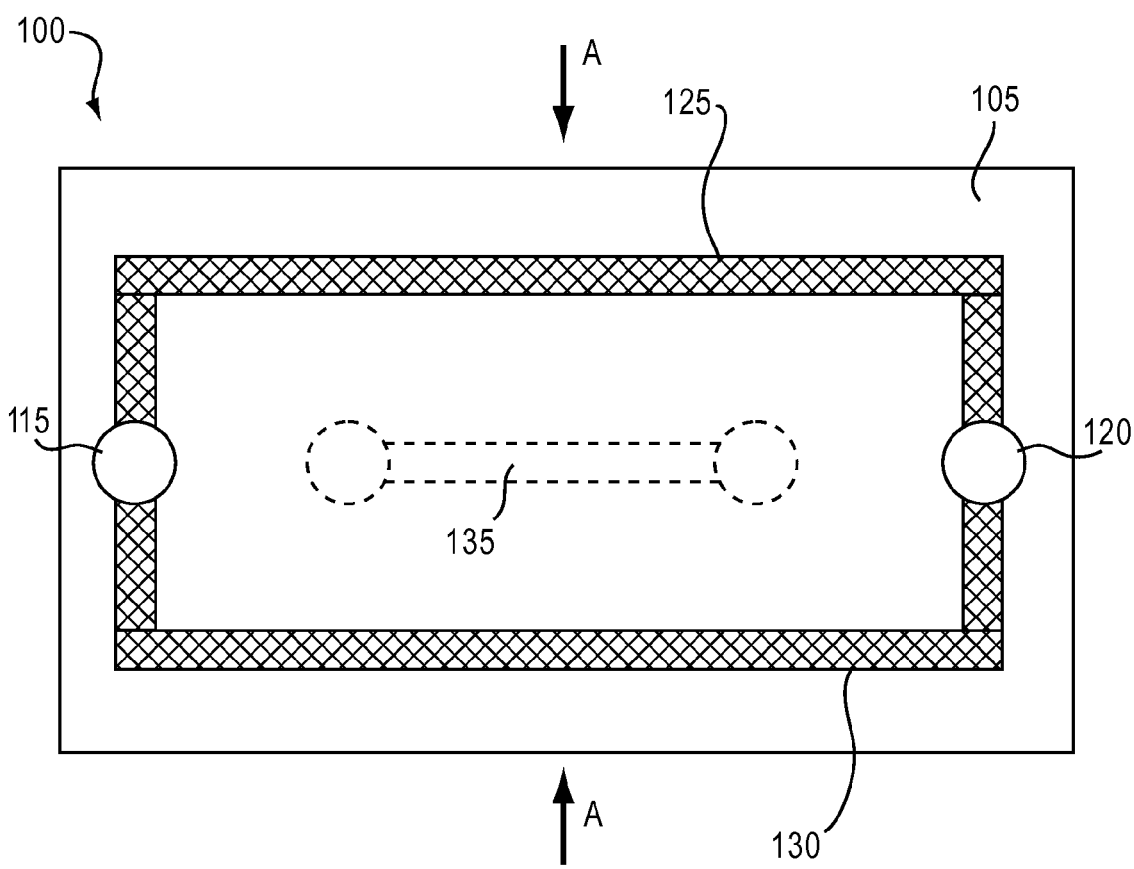
FIG. 1 is a top view of a directional coupler showing the placement of a backside surface sensor line in accordance with an illustrative embodiment of the invention.
Figure 2:
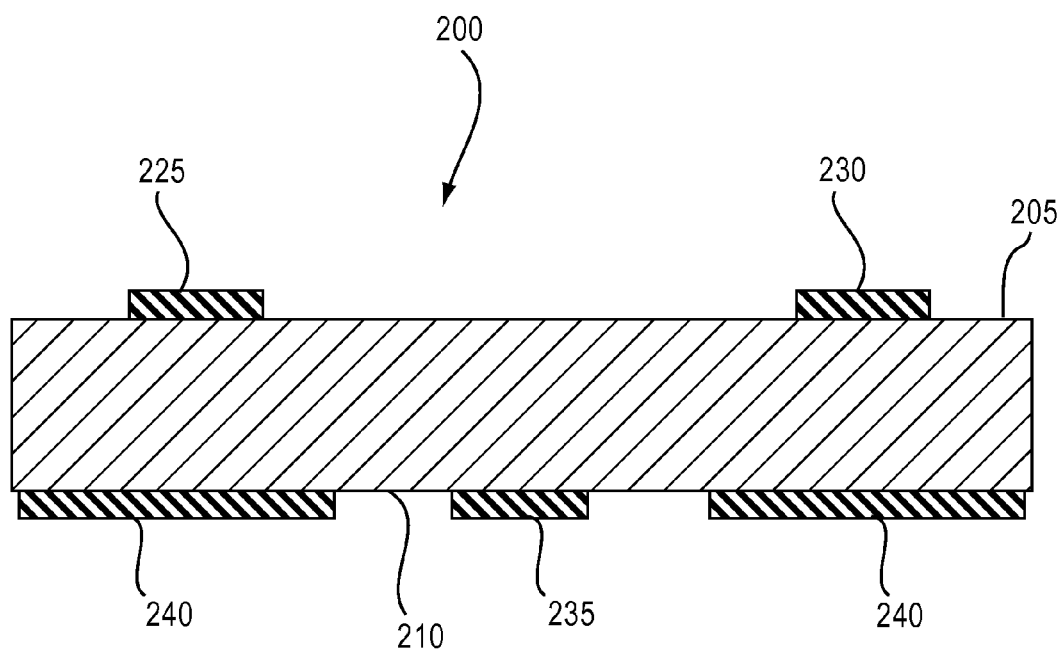
FIG. 2 is a cross-sectional view of the directional coupler shown in FIG. 1 along section A-A in accordance with an illustrative embodiment of the invention.

Referring now to the drawings, where like or similar elements are designated with identical reference numerals throughout the several views where appropriate, and referring in particular to FIGS. 1 & 2, shown is a top view and a cross-sectional view along A-A of a directional coupler 100, 200 in accordance with an illustrative embodiment of the invention. One directional coupler 100 comprises a dielectric substrate having a top surface 105, 205 and a backside surface 210. The dielectric substrate may comprise a ceramic material in one embodiment. However, other materials known in the art are also contemplated. The top surface 105 in one embodiment comprises a power line input comprising an input port 115. The power line input port 115 is adapted to receive power from a power supply, such as, but not limited to, an RF generator adapted to supply power to a plasma chamber. The top surface also includes a power line output comprising an output port 120 adapted to supply power to a power line coupled to a device such as, but not limited to, the plasma chamber. Coupled to the two ports 115, 120 is a first power line trace 125 and a second power line trace 130 in parallel with the first trace 125.

The backside surface 210 comprises a sensor line 235. The sensor line 235 generally runs parallel to the first and second power line traces 225, 230. However, the sensor line 235 is not electrically coupled in parallel to the power line traces 225, 230. In one embodiment, the distance from the sensor line 235 to the first and second traces 225, 230 is substantially equal. Furthermore, the sensor line 235 in one embodiment comprises a substantially equal coupling coefficient with the first power line trace 225 and the second power line trace 230. A power line signal in the top surface power line traces 125, 130 induces a signal in the sensor line 235 that is proportional to the power line signal. A sensor line signal level may then be measured through a measurement device electronically coupled to the sensor line 235, and a power line signal level may then be determined based on the measured sensor line signal level.

The directional coupler 200 having a top surface 205 with two power line traces 225, 230 and a backside surface 210 with a sensor line 235 allows for greater placement tolerances than directional couplers having single power lines and sensor lines printed on a single substrate surface. With the present invention, for example, if some displacement between the top and bottom prints takes place during manufacturing, the change in coupling coefficient to one trace is inversely proportional to the change with the other. Therefore, as the coupling coefficient goes up as compared to one trace it will go down as compared to the other. This may occur when the distance between the sensor line 235 and the first trace 225 does not substantially equal the distance between the signal line 235 and the second trace 230. When relatively small displacement offset may occur, as compared to the overall dimensions of the coupler 100, there is almost full mutual compensation of the coupling coefficient variations.

Figure 5:
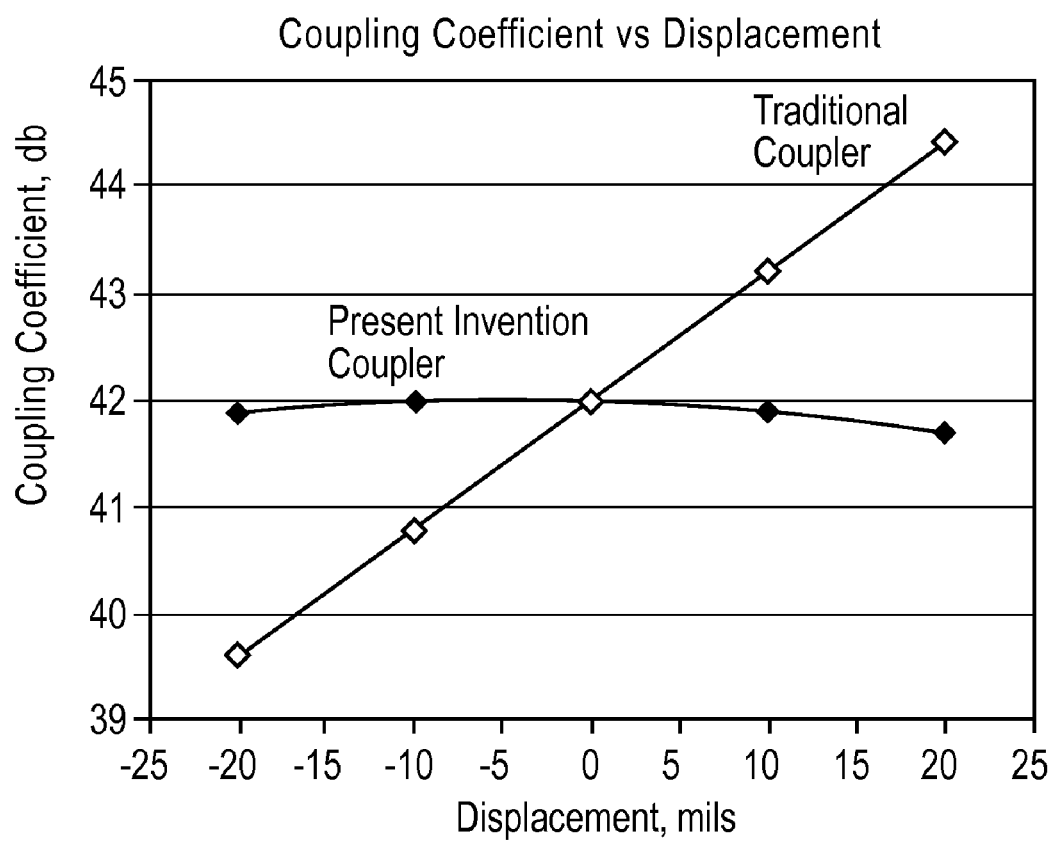
FIG. 5 is a graph displaying the effect of top surface and bottom surface displacement on the coupling coefficient value in accordance with an illustrative embodiment of the invention.

FIG. 5 shows the effect that displacement, or print offset, between the top and bottom prints, has on the coupling coefficient for both traditional couplers having single power lines and sensor lines printed on a single substrate surface and the present invention. As can be seen, a displacement of 5-10 mils causes a negligible change in the coupling coefficient of the present invention, but can cause a great enough change in the coupling coefficient of a traditional coupler that a user may be required to perform adjustments in order to obtain accurate power signal level measurements. The present invention may adequately operate without the need for adjustment in many applications with displacement print offsets of up to 20 mils or greater. As seen in FIG. 5, a print offset of 20 mils between the sensor line 235 and the first and second power line traces 125 130 comprises a change in coupling coefficient of less than 0.5 decibels (dB).

Figure 4:
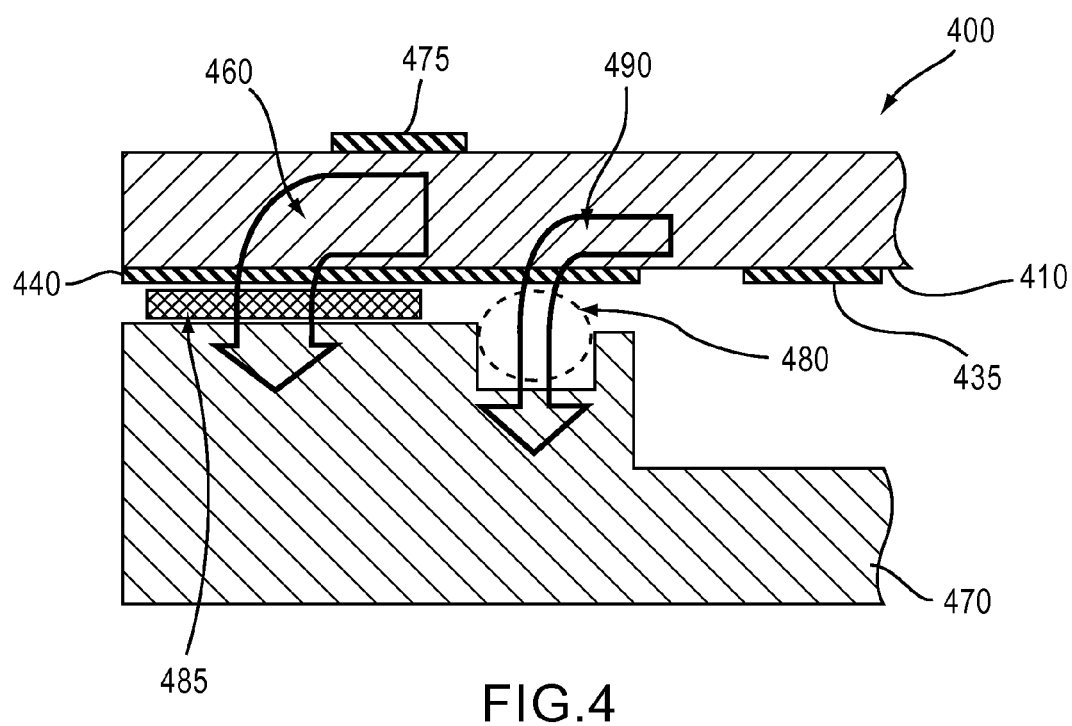
FIG. 4 is a close-up view of a portion of a directional coupler system comprising the directional coupler in FIG. 1 along section A-A highlighting thermal and electrical flow paths in accordance with an illustrative embodiment of the invention.

Referring again to FIG. 2, in one embodiment, the backside surface 210 further comprises a metallization section 240. The metallization section 240 comprises a metal, coupled to the backside surface 210, that is used as an electric ground. The backside surface 210 may include one or more metallization sections 240. For example, in one embodiment, the metallization section 240 may generally surround the signal line 235, which can be generally placed length-wise on the backside surface 210 proximal the center of the backside surface 210. The metallization section 240 may extend towards, and end proximal, a side of the substrate 105. In another embodiment, the metallization section 240 may comprise two or more sections running lengthwise along the backside surface 210. There is no limit to the configuration of the metallization section 240 or sections as new metallization designs and materials may be found which maximize an RF current flow 490, as shown in FIG. 4.

Figure 3:
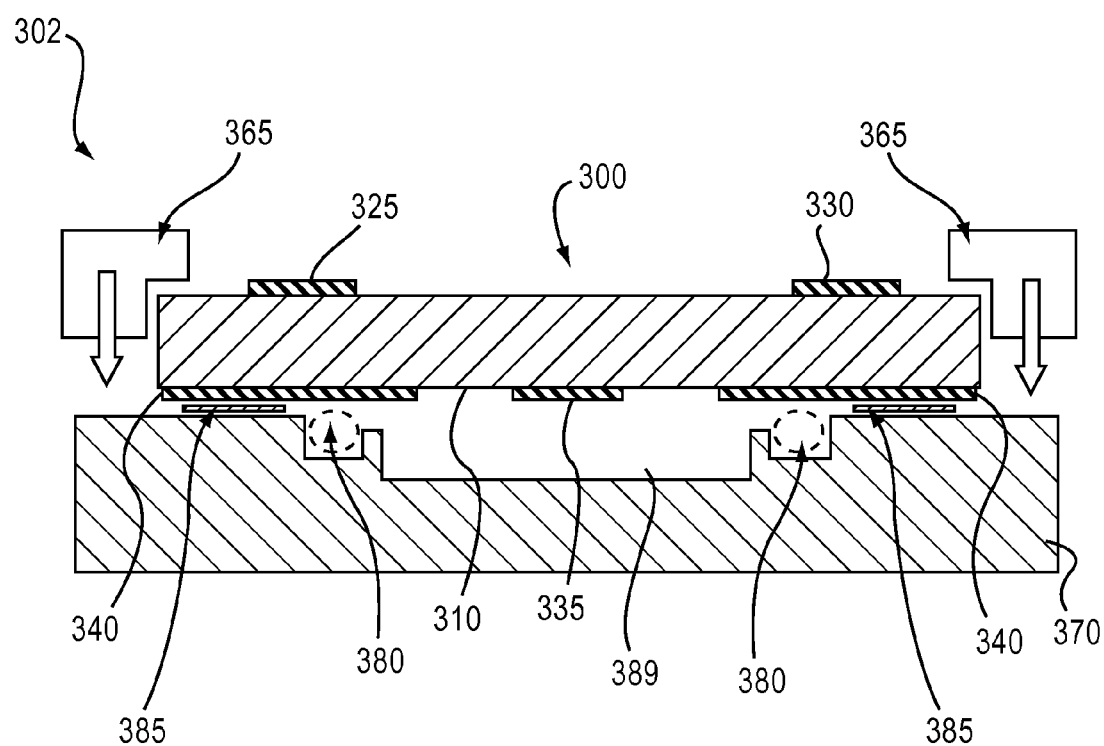
FIG. 3 is a cross-sectional view of a directional coupler system comprising the directional coupler in FIG. 1 along section A-A in accordance with an illustrative embodiment of the invention.
Figure 6:
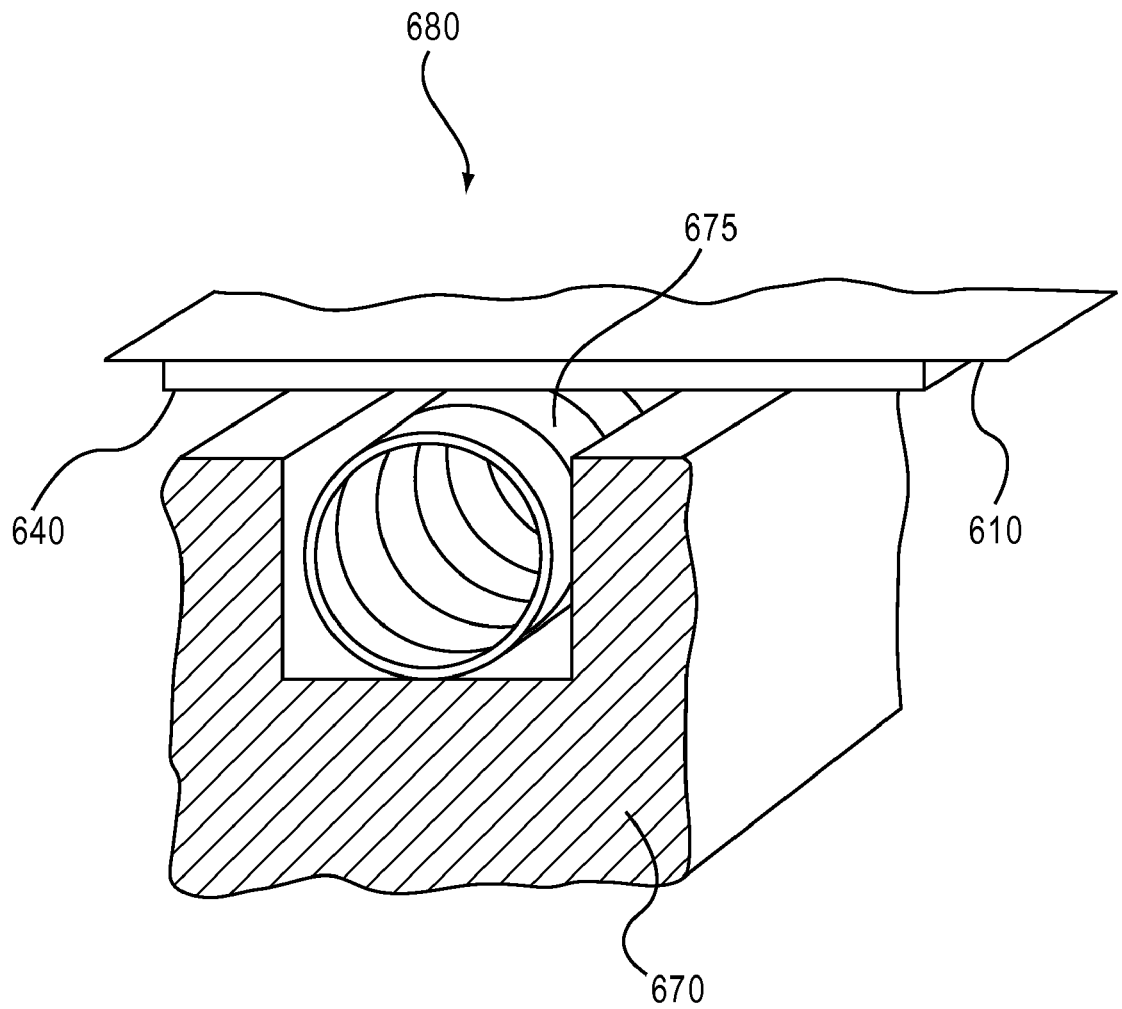
FIG. 6 is an isometric view of an electrical interface comprising a helical spring in accordance with an illustrative embodiment of the invention.

The RF current flow 490 occurs in one embodiment through an electrical interface 480. One electrical interface 480 comprises a helical gasket spring 675, as seen in FIG. 6. Through the use of a coupling apparatus comprising one or more clamps 365 and the spring 675, as seen in FIG. 3, the spring 675 creates an electrical connection between the ground plane of the coupler (the backside metallization 640) and a base platform 670. In one embodiment, as power flows through the power line traces 125, 130, RF current flows through the substrate towards and through the spring 675 to the platform 670.

As power flows through the power line traces 125, 235, heat also flows through the substrate towards the base platform 470. As seen in FIG. 4, a heat flow 460 travels from the power line traces 425, 430 through the substrate and a thermal interface 485 between the coupler 400 and the platform 470. One thermal interface may be comprised of a thermal compound adapted to facilitate the transfer of heat from the coupler 100 to the platform 470. The compound may be placed, or sandwiched, between the platform 470 and the metallization section 440. In one embodiment, the compound 485 may be placed between the metallization section 440 and the platform 470 proximal one or more edges of the substrate, and seen in FIG. 4. Also as seen in FIG. 4, the electrical interface 480 may be generally placed between the thermal interface 485 and the sensor line 435.

Referring now to FIG. 3, shown is a directional coupler system 302. One directional coupler system 302 comprises a directional coupler 300 (e.g., the directional coupler shown in FIGS. 1 and 2). In addition to the directional coupler 300, the directional coupler system 302 comprises a thermo-conductive base platform 370. The platform 370 in one embodiment is coupled to the metalized portion 340 of the backside surface 310. In one embodiment, the platform 370 may be coupled to the metalized section 340 through the use of a solder joint acting as an electrical interface 380 and thermal interface 385. However, in other embodiments, the platform 370 may be coupled to the coupler 300 through the use of the clamp 365 and spring 675. The system 302 shown in FIG. 3 and elsewhere operates in substantially the same way as the coupler 100 shown and described in FIGS. 1, 2, and elsewhere. Furthermore, in one embodiment, the platform 370 may comprise a gap 389 below the sensor line 335. Through the use of one or more springs as the electrical interface 380 and the use of a thermal compound in the interface 385, the system 302 may comprise a more mechanically flexible system adapted to withstand greater mechanical stresses on the coupler/platform, through thermal expansion or otherwise.

Figure 7:
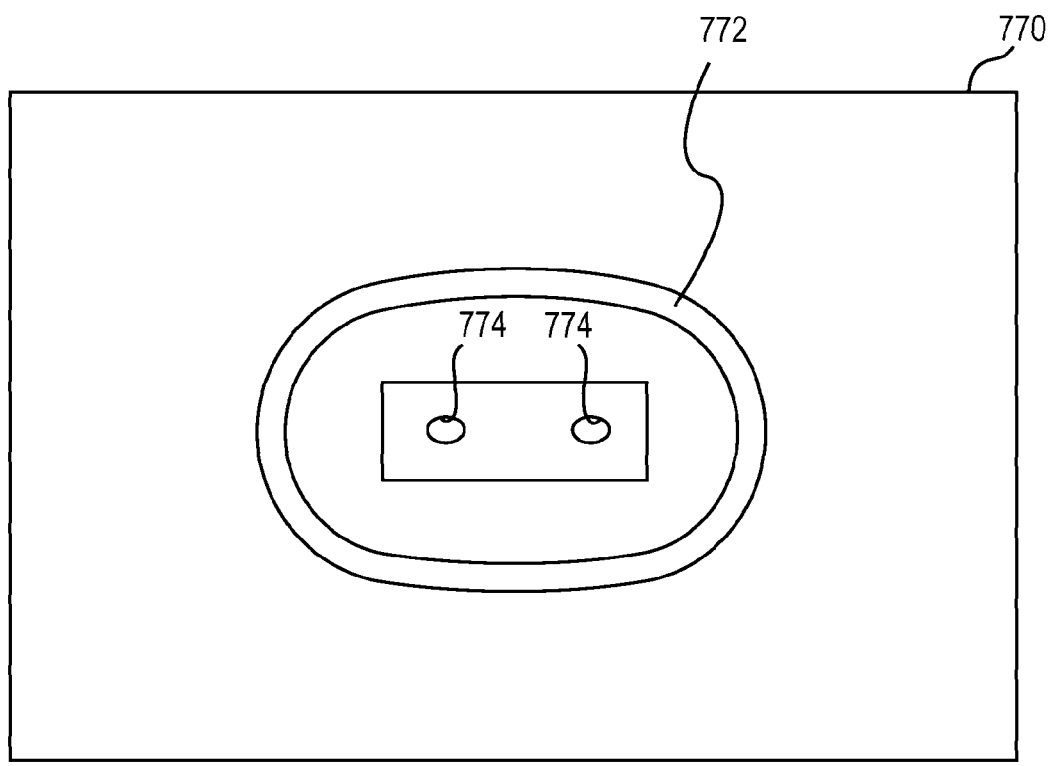
FIG. 7 is a top view of a base platform in accordance with an illustrative embodiment of the invention.

The spring 675 may comprise a helical spring which may be generally elliptical or circular, thereby giving the spring a "donut-shape" in one embodiment. The spring 675 is adapted to fit within a ring-shaped groove 772 on the platform, such as the one seen in FIG. 7. The clamps 365 provide a downward force to the coupler 300, shown by the arrows in FIG. 3, and may hold the coupler 300 against the spring 380. As seen in FIG. 7, the platform may also be comprised of one or more bores 774. The one or more bores 774 may be adapted to receive an apparatus such as, but not limited to, a cable electronically coupled to, and adapted to receive a signal from, a sensor line (e.g., sensor line 335). The signal may comprise a signal line output in one embodiment and may be adapted to determine a power signal level.

Moving now to FIG. 8, shown is a method of determining a power level supplied to a plasma chamber from an RF generator. At 899, one embodiment of the method comprises supplying power to a directional coupler such as, but not limited to, the directional coupler in FIGS. 1 & 2. In one embodiment, a power signal is supplied to a directional coupler input. One method may comprise employing the coupler system 302 shown and described in FIGS. 3 & 4. Therefore, the power may be supplied to the power line input port 115 shown in FIG. 1. At 898, power is drawn towards a directional coupler power line output coupled to a top surface of a directional coupler substrate. In one embodiment, the power is drawn towards the output port 120 along two parallel power line traces 125 130. At 897, a signal is induced in a sensor line. For example, in one embodiment, a signal is induced in the sensor line 135 coupled to the backside surface 210 of the substrate, as seen in FIGS. 1 & 2. Furthermore, the sensor line 135 may be located a substantially equal distance from the two power line traces 125, 130. At 896 and 894, the sensor line signal is then captured, measured, and used to determine the power signal level. In one method, the sensor line signal level is substantially unaffected by creating an offset of 20 mils between the sensor line and the first and second power line traces.

In additional methods, a portion of the directional coupler substrate backside surface may comprise a metallization section 140, 240, as seen in FIGS. 1 and 2. In such an embodiment, or in other embodiments, a method may include coupling the metallization section 240 to a base platform 370 470, as seen in FIGS. 3 & 4. One base platform 370, 470 may comprise an electro/thermo conductive base platform adapted to operate both as a heat sink and to provide a ground source for an RF current. Heat may be generated in the directional coupler 100, 200 through the power signal flowing through the power line traces 125, 130. However, through coupling the substrate to the base platform 370, 470, in one method, heat flows from the substrate to the base platform, reducing the temperature, or keeping the temperature at a stable level.

In conclusion, the present invention provides, among other things, a system and method for determining a power level supplied to a plasma chamber from an RF generator. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in this disclosure.

What is claimed is:

1. A directional coupler system comprising,
   a substrate comprising a top surface and a backside surface,
      the backside surface having a metalization ground portion and an unmetalized portion;
   a power line coupled to the top surface comprising,
      an input adapted to receive a power signal,
      a first trace coupled to the input,
      a second trace in parallel with the first trace and coupled to the input, and
      an output coupled to the first and second traces and adapted to emit the power signal; and
   a sensor line coupled to the backside surface unmetalized portion, the sensor line adapted to emit a sensor line signal having a sensor line signal level generally proportional to the power signal.

2. The directional coupler of claim 1 further including, a thermo-conductive base platform coupled to the metalized portion of the backside surface.

3. The directional coupler system of claim 2 wherein, a thermal compound is sandwiched between the thermo-conductive base platform and backside surface metalization ground portion.

4. The directional coupler system of claim 2 wherein, a heat flow is adapted to travel from the power line to the thermo-conductive base platform, generally through the backside surface metalized portion and thermal compound.

5. The directional coupler system of claim 2 further comprising, at least one spring and at least one clamp; wherein,
   the at least one spring and clamp are adapted to couple the substrate to the thermo-conductive platform;
   an RF current flow is adapted to flow from the platform through the at least one spring.

6. The directional coupler system of claim 5 wherein,
   the at least one spring comprises an electro-conductive helical spring;
   the thermo-conductive base platform comprises a surface having a generally ring-shaped groove; and
   the helical spring is adapted to fit within the groove.

7. The directional coupler system of claim 2 wherein, the substrate is coupled to the thermo-conductive platform through at least one thermal interface and at least one electrical interface.

8. The directional coupler of claim 7 wherein,
   the at least one thermal interface comprises one of one or more solder joints and a thermal compound; and
   the at least one electrical interface comprises one of one or more solder joints and one or more springs.

9. The directional coupler system of claim 2 wherein, the thermo-conductive base platform comprises one or more bores, each of the one or more bores adapted to receive an apparatus, the apparatus adapted to receive a signal from the sensor line.

10. The directional coupler system of claim 9 wherein,
    the sensor line further comprises at least one output;
    the apparatus comprises one or more cables adapted to couple to the at least one output.

11. The directional coupler system of claim 1 wherein, the signal line runs substantially parallel to the first and second power line traces and is positioned a substantially equal distance from the first and second power lines.

12. A method of determining a power level supplied to a plasma chamber from an RF generator comprising,
    receiving a power signal at a directional coupler power line input;
    drawing the power signal towards a directional coupler power line output along two parallel power line traces coupled to a top surface of a directional coupler substrate;
    inducing a signal in a sensor line coupled to a directional coupler substrate backside surface;
    measuring a sensor line signal level; and
    using the sensor line signal level to determine the power level.

13. The method of claim 12 wherein, the sensor line is located a substantially equal distance from the two power line traces.

14. The method of claim 12 wherein,
    a portion of the directional coupler substrate backside surface comprise a metallization portion; and further comprising,
    using a thermal compound in coupling at least a section of the metallization portion to a base platform; and
    flowing heat to the base platform through the metallization portion substrate.

15. The method of claim 12 wherein,
the two parallel power line traces comprise a first power line trace and a second power line trace;
the sensor line runs in substantially the same direction as the first and second power line traces; and
the sensor line signal level is substantially unaffected by creating an offset of 20 mils between the sensor line and the first and second power line traces.

16. The method of claim 12 further comprising,
coupling the substrate to a base platform, wherein the substrate is coupled to the base platform with a coupling apparatus comprising a spring; and
flowing RF current to the base platform through the spring.

* * * * *